US005130577A

United States Patent [19]

Neidorff et al.

[11] Patent Number: 5,130,577

[45] Date of Patent: Jul. 14, 1992

[54] COMPUTATIONAL CIRCUIT FOR TRANSFORMING AN ANALOG INPUT VOLTAGE INTO ATTENUATED OUTPUT CURRENT PROPORTIONAL TO A SELECTED TRANSFER FUNCTION

[75] Inventors: Robert A. Neidorff, Bedford, N.H.; Larry J. Wofford, Cary, N.C.

[73] Assignee: Unitrode Corporation, Billerica, Mass.

[21] Appl. No.: 506,351

[22] Filed: Apr. 9, 1990

[51] Int. Cl.[5] .......................... G06G 7/12; H03K 5/00; H03K 5/153; H03K 5/08

[52] U.S. Cl. .................................... 307/490; 307/493; 307/261; 307/360; 328/28; 328/142

[58] Field of Search ............... 307/490, 493, 254, 270, 307/242, 555, 558, 261, 360, 363, 514; 328/27, 28, 136, 142, 143, 147, 150

[56] References Cited

U.S. PATENT DOCUMENTS

| | | | |
|---|---|---|---|
| 2,820,110 | 1/1958 | Valeton et al. | 328/143 |
| 3,644,835 | 2/1972 | Thompson | 307/514 |
| 3,708,693 | 1/1973 | Ferrier et al. | 307/361 |
| 3,876,888 | 4/1975 | Gyugyi et al. | 328/27 |
| 4,207,478 | 6/1980 | Marumoto et al. | 307/254 |
| 4,677,366 | 6/1987 | Wilkinson | 323/222 |

OTHER PUBLICATIONS

*National Semiconductor Corp. Applications Note* #31 Jun., 1986, Revision, p. 19.

*Analog-Digital Conversion Notes* Chapter 11-1, pp. 116-117, 1977.

*Primary Examiner*—Stanley D. Miller
*Assistant Examiner*—Trong Phan
*Attorney, Agent, or Firm*—Weingarten, Schurgin, Gagnebin & Hayes

[57] ABSTRACT

An analog computational circuit, for transforming an input voltage into an output voltage or current variable according to a selected transfer function, including a plurality of current sources having a common input and a common current output. Each of the current sources is energizable in response to an input voltage as it exceeds a selected input voltage threshold associated with each of the current sources. There are means coupled to the current sources for establishing the input voltage threshold associated with each of the current sources. Also included are means coupled to each of the current sources for establishing the selected transfer function of the computational circuit. Each of the current sources is adapted to begin conducting current in response to an input voltage which exceeds its associated input voltage threshold, and to provide an attenuated output current proportional to the input voltage, the proporation established by the selected transfer function. The analog computational circuit is integratable into other circuits.

9 Claims, 1 Drawing Sheet

COMPUTATIONAL CIRCUIT FOR TRANSFORMING AN ANALOG INPUT VOLTAGE INTO ATTENUATED OUTPUT CURRENT PROPORTIONAL TO A SELECTED TRANSFER FUNCTION

FIELD OF THE INVENTION

This invention relates to analog computational circuits and more particularly, to circuits for attenuating an input voltage according to a selected transfer function.

BACKGROUND OF THE INVENTION

Manufacturers of electronic circuits such as power supplies often need to include power factor correction circuitry along with the remainder of the power supply circuitry. A power factor corrector requires a circuit capable of squaring an analog voltage.

Prior art attempts at squaring an analog voltage include a log/antilog circuit. This implementation requires the circuit to take the natural logarithm of the voltage, multiply it by two, then take the inverse natural logarithm of the result. This type of circuit is complex, consumes a considerable amount of power, is slow, and is susceptible to many errors due to component matching, thermal gradients, and large signal non-linearities. Such a device is disclosed in *National Semiconductor Corp. Applications Note* #31, Jun., 1986 Revision, Page 19.

Another approach at providing an analog squaring circuit is shown in U.S. Pat. No. 4,677,366 wherein two resistors along with a zener diode across one resistor implement a rudimentary, one breakpoint, linear approximation of a squaring function. This method, however, is inherently inaccurate due to temperature drift characteristics of the zener diode. Most importantly, the dynamic range and accuracy of this method is dependent upon the breakdown voltage of the zener diode. Given that the lowest useful zener diode voltage is approximately 4.7 volts, a two breakpoint squaring approximation would require an input voltage of greater than approximately ten volts. An even more accurate squaring function approximation would require an even larger input signal.

SUMMARY OF THE INVENTION

This invention features a simple, low cost, temperature insensitive, computational circuit for transforming an input voltage into an attenuated output current or voltage according to a selected transfer function. This invention is achieved by providing a plurality of current sources having a common input and a common current output. Each of the current sources is energizable in response to an input voltage which exceeds a predetermined, selected input voltage threshold. Each of the current sources is coupled to a circuit for establishing the selected transfer function of the computational circuit as well as circuitry for establishing the associated input voltage threshold for each of the plurality of current sources.

Each of the plurality of current sources is adapted to begin conducting current in response to an input voltage which exceeds its associated input voltage threshold, and for providing an output current which is proportional to the input voltage minus the input voltage threshold, and which is a function of the selected transfer function.

In the preferred embodiment, the plurality of current sources are comprised of a plurality of transistors wherein the base of each transistor is coupled to the bases of the other transistors, serving as a common input. The collectors are similarly coupled together serving as the common current output. The circuitry for establishing the selected transfer function of the circuit as well as the circuitry for providing associated output voltage thresholds are coupled to the transistor emitters.

In the preferred embodiment, the circuitry for establishing the selected transfer function of the computational circuit includes a resistor in series with each of the transistor emitters, while the associated input voltage thresholds are established by a voltage divider ladder formed by a number of resistors. Additionally, the circuit may include a voltage translator coupled between the input voltage and the common input to the current sources, for translating the input voltage from a first voltage level to a second voltage level.

DESCRIPTION OF THE DRAWINGS

These and other features of the present invention will be more readily understood by reading the following detailed description, taken together with the drawings, wherein.

DETAILED DESCRIPTION OF THE INVENTION

Figure 1:
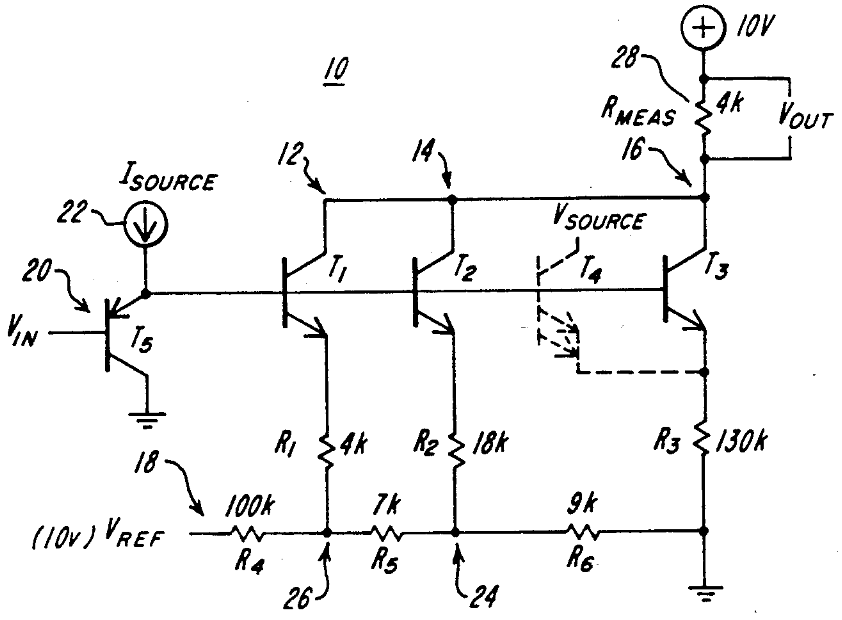
FIG. 1 is a schematic representation of an analog computational circuit according to this invention, implementing a squaring function.

One implementation of the analog computational circuit according to this invention is squaring circuit 10, FIG. 1, adapted for providing a three breakpoint approximation to a square transfer function.

Squaring circuit 10 is comprised of three stages 12, 14 and 16. Each stage includes at least one current source such as an NPN transistor, along with a resistor in series with the emitter of the NPN transistor. Thus, stage 12 comprises transistor $T_1$ and resistor $R_1$, stage 14 comprises transistor $T_2$ and resistor $R_2$, and stage 16 comprises transistor $T_3$ and resistor $R_3$. The resistors in series with the transistor emitters establish the function of the circuit. All of the transistors have a common base connection which serves as a common input to all three stages. In addition, the collectors of all three transistors are connected to a common point and serve as the current output for the respective stages.

Voltage ladder 18 determines the "breakpoints" or voltage levels at which each individual stage will begin conducting current. Finally, voltage level shifting PNP transistor 20 may be connected to I source 22 and to the common input of the current sources. Voltage level shifter 20, although not necessary for operation of the computational circuit, serves as a level shifter for balancing the effect of one diode drop across the transistors of the various stages. Without this level shifter, an input voltage would have to exceed approximately 0.7 volts before the first output stage would begin conducting current.

The breakpoints of the computational circuit are provided by voltage ladder 18. Their respective values are calculated using standard voltage divider formulas.

For example, the breakpoint or voltage level VR6 at node 24 between R5 and R6 would be calculated as follows:

$$VR6 = Vref \times R6/(R4+R5+R6) \quad (1)$$

In this implementation, VR6 on node 24 equals approximately 0.78 volts. Similarly, the voltage VR5 on node 26 between R4 and R5 would be calculated as follows:

$$VR5 = Vref \times (R5+R6)/(R4+R5+R6) \quad (2)$$

which in this implementation equals approximately 1.38 volts.

The operation of the computational circuit is as follows. An input voltage is applied to the base of level shifter 20. If the input voltage is less than the first breakpoint or voltage on node 24, namely 0.78 volts, only the first stage comprising transistor T3 and resistor R3 will begin conducting current. The amount of current that will flow through the collector may be calculated by the formula:

$$Iout = Vin/R3 \text{ and} \quad (3)$$

$$Vout = Rout \times Vin/R3 \text{ (for } Vin < VR6) \quad (4)$$

This first stage will implement the first of multiple breakpoint approximations to the square transfer function. In an alternative embodiment, the first stage may include transistor $T_4$ in which case $T_3$ as well as $T_4$ would be matched, ratioed transistors, the ratio of $T_4$ to $T_3$ being 2 to 1 in this example. In this manner, transistor $T_4$ will carry twice the amount of current as $T_3$. In so doing, the value of R3 may be reduced by ⅓ from approximately 130k ohms to approximately 45k ohms. This change is useful in reducing the area of silicon required to implement the larger value resistor.

If the input voltage exceeds the first breakpoint or 0.78 volts, and is less than the second breakpoint, 1.3 volts, then both the first and second stages 16 and 14 will conduct current. A sense resistor 28 may be provided in series with the current output and across which an output voltage may be measured. In this example, the value of the output voltage for two stages would be computed as follows:

$$Vout = Rout \times (Vin/R3 + (Vin - VR6)/R2) \quad (5)$$

Similarly, once the input voltage exceeds the second and final breakpoint or 1.3 volts, third stage 12 will begin conducting current and the output voltage may be calculated as follows:

$$Vout = Rout \times (Vin/R3 + (Vin - VR6)/R2 + (Vin - VR5)/R1) \quad (6)$$

Equations 1-5 are approximate, however, since they do not take into account the impedance of voltage ladder 18. In this implementation of a squaring function, the values R4 and R5 are quite large compared to the values of R1 and R2, and therefore a more accurate approximation of equations 4, 5, and 6 would require that we take into account the impedance of the voltage ladder. For example, equation 4 would be more accurate if R2 were replaced by:

$$R2 + R6 \times (R4+R5)/(R4+R5+R6) \quad (7)$$

Figure 2:
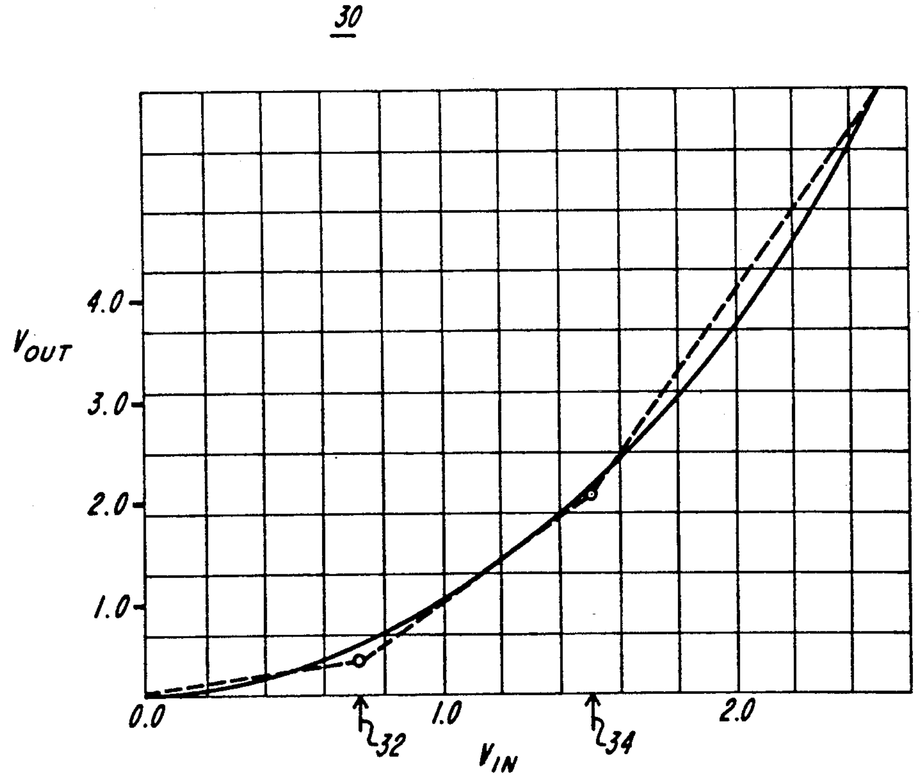
FIG. 2 is a graph of an ideal square transfer function of the analog computational circuit of FIG. 1.

The result of the analog computational circuit of FIG. 1 and the effects of the slight shift in breakpoints can be seen in graph 30, FIG. 2, wherein the solid line represents an actual square transfer function, while the dotted line represents a computer simulation of the results achieved by the circuit in FIG. 1. The first breakpoint occurs at approximately 0.78 volts as indicated by arrow 32, whereas the second breakpoint indicated by arrow 34 has shifted from the initial estimate of 1.3 volts to an actual level of approximately 1.45 volts. As is evident, the computed output voltage approximates an actual square transfer function with less than 2% overall error.

Accordingly, using this same approach, generally any accuracy of approximation to $V_{in}$ squared, cubed, etc. can be implemented with the proper choice of resistors, voltage ladder, and number of stages. Both the transfer function as well as input dynamic range are controlled by choice of resistor values. In addition, since the analog computational circuit according to this invention relies on the ratio of the value of the resistors in the voltage ladder and in the current source path for achieving the desired transfer function with multiple breakpoints, the circuit is temperature insensitive and has unlimited applicability and potential accuracy. Further, although shown as a stand alone circuit, the analog computational circuit of this invention is integrable into other circuit structures.

Modifications and substitutions to the present invention by one of ordinary skill in the art are considered within the scope of the present invention and the claims which follow.

We claim:

1. A computational circuit for transforming an analog input voltage into an attenuated output current according to a selected transfer function, comprising:

a plurality of current sources, each of said plurality of current sources including a single active element having a common control input and a common current output, each of said plurality of current sources individually selectively energizable in succession in response to an input voltage of increasing magnitude applied to said common control input as said increasing magnitude of input voltage exceeds a predetermined input voltage threshold associated with each of said current sources;

means, coupled to each of said plurality of current sources, for establishing said predetermined, successive input voltage threshold associated with each of said plurality of current sources;

means, individually coupled to each of said plurality of current sources, for establishing a selected transfer function for said computational circuit;

voltage translation means, coupled between said input voltage and said common input to said plurality of current sources, for transforming said input voltage from a first voltage level to a second higher voltage level, for negating the effects of current source voltage and temperature biasing; and wherein each of said plurality of current sources begins conducting current in response to an analog input voltage which exceeds its associated predetermined input voltage threshold, and provides an attenuated output current in proportion to said input voltage and as a function of said selected transfer function.

2. The circuit of claim 1 wherein said active element includes a transistor.

3. The circuit of claim 2 wherein the base of each of said transistors are commonly coupled and serve as the common control input to each of said transistors;

the collector of each of said transistors are commonly coupled and serve as the common current output; and the emitters of each of said transistors are individually coupled to said means for establishing a selected transfer function and said means for establishing an associated input voltage threshold.

4. The circuit of claim 2 wherein said transistor is a bipolar transistor.

5. The circuit of claim 1 further including a load transistor in series with said output current, for providing an attenuated output voltage.

6. The circuit of claim 1 wherein said means for establishing a selected transfer function includes resistor means in series with said common current output.

7. The circuit of claim 1 wherein said means for establishing said associated predetermined input voltage thresholds includes means for providing a succession of increasing voltage potentials.

8. The circuit of claim 7 wherein said means for providing a succession of increasing voltage potentials includes a plurality of resistors in series with a voltage source and ground.

9. A computational circuit for transforming an analog input voltage into an attenuated output current according to a selected transfer function, comprising:

a plurality of transistors, each transistor individually operative as a current source, each of said transistors including a base region coupled to the base regions of the other said transistors and operative as a common current source control input, each of said transistors also including a collector region coupled to the collector regions of the other said transistors and operative as a common current output, each of said plurality of transistors individually selectively energizable in succession by applying increasing magnitudes of input voltage to said common current source control input as said increasing magnitudes of input voltage exceed a predetermined input voltage threshold associated with each transistor;

each of said plurality of transistors further including an emitter region, each emitter region coupled to at least one of a plurality of resistors, for establishing a selected transfer function for said computational circuit;

voltage translation means, coupled between said input voltage and said common input to said plurality of transistors, for transforming said input voltage from a first voltage level to a second higher voltage level, for negating the effects of current source voltage and temperature biasing; and wherein each of said plurality of transistors begin conducting current in response to an input voltage which exceeds its associated input voltage threshold, and provides an attenuated output current in proportion to said input voltage and as a function of said plurality of resistor elements establishing said selected transfer function.

* * * * *